Feb. 14, 1961 C. E. LOWE 2,972,116
EMITTER FOLLOWER TRANSISTOR OSCILLATOR
Filed Nov. 28, 1958

INVENTOR.
Charles E. Lowe
BY
Paul J. Ellington
ATTORNEY

United States Patent Office 2,972,116

Patented Feb. 14, 1961

2,972,116

EMITTER FOLLOWER TRANSISTOR OSCILLATOR

Charles E. Lowe, Fenton, Mich., assignor to General Motors Corporation, Detroit, Mich., a corporation of Delaware Filed Nov. 28, 1958, Ser. No. 777,047

7 Claims. (Cl. 331—117)

This invention relates to oscillator circuits and more particularly to a transistor oscillator especially useful as an on-off control device.

In accordance with this invention, a transistor is connected in an emitter follower or common collector circuit configuration which includes parallel resonant base and emitter circuits. This circuit arrangement exhibits a high degree of frequency selectivity when the parallel resonant frequency of the base circuit is higher than that of the emitter circuit and oscillations are generated at a selected intermediate frequency in the range of frequencies where transit time effects are appreciable in the base-emitter junction. When oscillations are generated, the direct current from the power supply in the collector circuit is of relatively high value. When the resonant frequency of the base circuit is equal to or lower than that of the emitter circuit, no oscillations are generated and the direct current is reduced to a low value. The change in resonant frequency for switching between such "on" and "off" conditions is produced by a variation of reactance in one of the resonant circuits; for example, by very slight movement of a core in the field of a coil. The oscillator operates as a control switch without contacts and is capable of directly energizing control motors and relays. As a control oscillator, it is admirably suited for applications requiring sensitive power control at high speed in response to minute mechanical movements or proximity effects of metallic objects.

A more complete understanding of this invention may be had from the detailed description which follows taken with the accompanying drawings in which.

Figure 1:
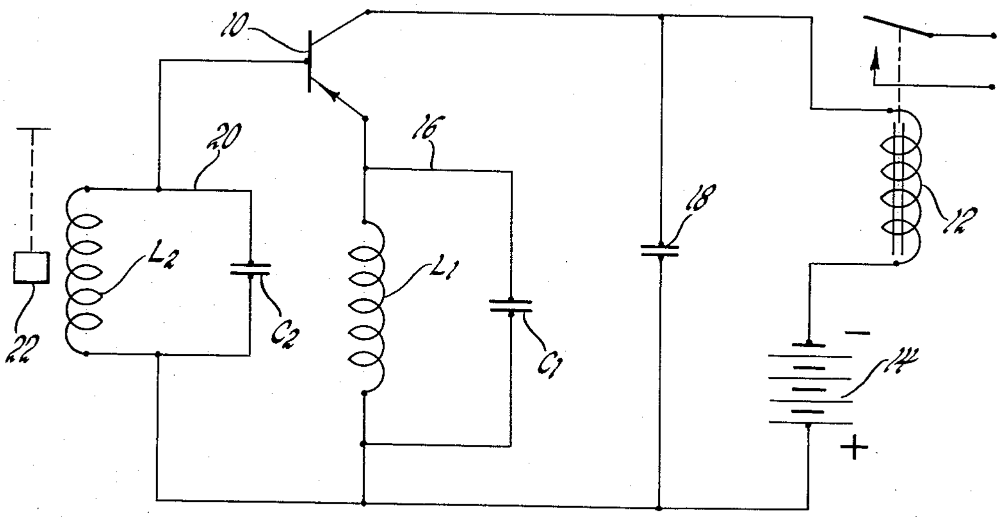
Figure 1 is a schematic diagram of the inventive circuit.

Referring now to the drawings, there is shown an illustrative embodiment of the invention in a control oscillator utilizing a transistor connected in common collector configuration and adapted as an on-off switch for a relay device. The embodiment utilizes a junction transistor 10 of the PNP type and it will become apparent that the NPN type also may be used with appropriate reversal of bias voltage polarity. The oscillator comprises the transistor 10 having an output circuit extending between its collector and emitter electrodes and an input circuit extending between its base and emitter electrodes. The collector electrode is connected through the energizing coil of a relay 12 to the negative terminal of a voltage source or battery 14. The emiter electrode is connected through a parallel resonant circuit 16 to the positive or common terminal of the battery 14. The parallel resonant circuit 16 includes an inductance or coil $L_1$ and a shunt condenser $C_1$ which have a resonant frequency $f_1$. A bypass condenser 18 for the oscillation frequency is connected across the battery and relay. The base electrode is connected to positive terminal of the battery 14 through a parallel resonant circuit 20 comprising an inductance or coil $L_2$ and a shunt condenser $C_2$ having a resonant frequency $f_2$ that is greater than $f_1$. The inductance of the coil $L_2$ may be varied over a range sufficient to change the resonant frequency $f_2$ to a value lower than $f_1$ by movement of a core 22 in the field of the coil $L_2$. The resonant frequencies $f_1$ and $f_2$ are both in the frequency region where transit time in the base-emitter junction produces a phase shift between base current and applied base voltage. This effect is especially pronounced in the regions of the alpha cut-off frequency for the transistor. For example, in an oscillator circuit using a 2N174 type transistor, an oscillation frequency of about 100 kc. may be obtained conveniently with the frequencies $f_1$ and $f_2$ spaced by a few kc.

Figure 2:
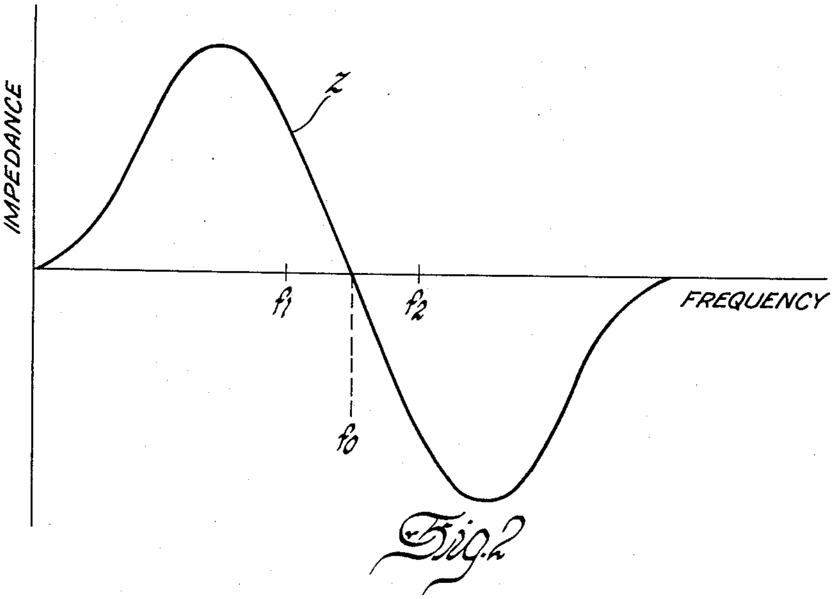
Figure 2 is a graphical representation of impedance as a function of frequency for a pair of parallel resonant circuits connected in series.

In this arrangement, oscillations are generated in the output circuit at a selected frequency $f_0$ intermediate the resonant frequency $f_1$ of emitter circuit 16 and the resonant frequency $f_2$ of the resonator circuit 20. At this selected oscillation frequency $f_0$, the parallel resonant circuit 16 presents a capacitive impedance in the emitter circuit and the parallel resonant circuit 20 presents an inductive impedance in the base circuit. In this condition, it appears that the parallel resonant circuits 16 and 20, through the emitter base junction of the transistor, form a series resonant circuit having an impedance Z which varies as a function of frequency as shown in Figure 2. At frequencies below the series resonance the impedance is inductive and at frequencies above series resonance, the impedance is capacitive and the circuit has a high degree of selectivity for the series resonant frequency. In the "on" or oscillating condition of the circuit, the current flow from the battery 14 is of relatively large value, for example, a few amperes, and is sufficient to energize the relay 12. The "off" or non-oscillating condition results when the parallel resonant circuit 20 is tuned to a frequency $f_2$ equal to or lower than the frequency $f_1$. In this condition, at a frequency between the resonant frequencies, the parallel resonant circuit 16 presents an inductive impedance in the emitter circuit and the parallel resonant circuit 20 presents a capacitive impedance in the base circuit and oscillations will not be produced. When the circuit is turned "off," only a few milliamperes of current flows from the battery. The on-off switching is readily accomplished by minute displacements of the core 22 and either the "on" or "off" condition persists until the resonant frequencies $f_1$ and $f_2$ are equal. Thus switching occurs at precisely the same points for either "on" or "off" actuation. It is noted that in the "off" condition there is no current through the coil $L_2$ so there is no influence on the core and it may be actuated by a very small force such as that produced by a meter movement.

A rigorous theory of circuit operation is not presently available but the concept of negative resistance affords a plausible explanation. In order to produce oscillations, there must be a transfer of energy from the battery 14 through the emitter circuit to the base circuit. The emitter-base diode of the transistor includes internal capacitance and resistance which, under proper conditions, appears to have a negative resistance component. One condition for oscillation is that the emitter circuit must have an effective capacitive reactance and this is obtained at an oscillation frequency greater than the tuned frequency of the parallel resonant circuit 16. When the oscillation frequency is in the region of the alpha cut-off frequency of the transistor the transit time, in the positive hole conduction from the emitter to the base, is an appreciable part of a cycle of oscillation. Consequently, current flow in the base circuit will lead the voltage by a phase angle which depends upon the frequency. This phase shift coupled with the leading phase shift produced by the effective capacitive reactance in the emitter circuit will cause the current in the base circuit to be more than 90° out of phase with the applied voltage of oscillation frequency. Thus, the emitter base diode appears as a negative resistance or generator transferring energy from the battery to the base circuit. The parallel resonant circuits in the emitter and base circuits together with any internal and stray capacitance have a series resonant frequency at the oscillation frequency. The series resonant mode of oscillation in the emitter and base circuits causes the emitter and collector circuits to generate oscillations at the oscillation frequency.

Although the description of this invention has been given with respect to a particular embodiment, it is not to be construed in a limiting sense. Numerous variations and modifications within the spirit and scope of the invention will not occur to those skilled in the art. For a definition of the invention, reference is made to the appended claims.

I claim:

1. An oscillator comprising a transistor having emitter, collector and base electrodes, a voltage source, the collector electrode being connected with one terminal of the voltage source, a first parallel resonant circuit connected between the emitter electrode and the other terminal of the voltage source, a second parallel resonant circuit connected between the base and said other terminal of the voltage source, the resonant frequency of the first parallel resonant circuit being lower than that of the second parallel resonant circuit, the resonant frequencies of both of said circuits being in the region where transit time in the base-emitter junction of the transistor causes a phase shift between current and voltage whereby oscillations are generated in the emitter-collector circuit at a frequency between the resonant frequencies.

2. An oscillator comprising a transistor having emitter, collector and base electrodes, a voltage source, the collector electrode being connected with one terminal of the voltage source, a first parallel resonant circuit connected between the emitter electrode and the other terminal of the voltage source, a second parallel resonant circuit connected between the base and the other terminal of the voltage source, means for varying the resonant frequency of one of said circuits so that the first circuit may be tuned to a frequency either lower or higher than that of the second circuit, the resonant frequencies of both of said circuits being in the region where transit time in the base-emitter junction of the transistor causes a phase shift between current and voltage whereby oscillations are generated when the first circuit is tuned to the lower frequency and no oscillations are generated when the first circuit is tuned to the higher frequency, and a pair of output terminals serially connected with said voltage source.

3. An oscillator comprising a transistor having emitter, collector and base electrodes, a voltage source, the collector electrode being connected with one terminal of the voltage source, a condenser and a coil connected in a first parallel circuit between the emitter electrode and the other terminal of the voltage source, a condenser and a coil connected in a second parallel circuit between the base and the other terminal of the voltage source, movable core means in the field of one of said coils for tuning one of the circuits to a parallel resonant frequency either higher or lower than that of the other, the parallel resonant frequencies of both of said circuits being in the region where transit time in the base-emitter junction of the transistor causes a phase shift between current and voltage whereby oscillations are generated in the emitter-collector circuit at a frequency between the resonant frequencies, when the first circuit is tuned to the lower frequency and no oscillations are generated when the first circuit is tuned to the higher frequency, and a pair of output terminals connected in series with said voltage source.

4. An oscillator comprising a transistor having emitter, collector and base electrodes, a direct current voltage source, the collector electrode being connected with one terminal of the voltage source, a condenser and a coil connected in a first parallel circuit between the emitter electrode and the other terminal of the voltage source, a condenser and a coil connected in a second parallel circuit between the base and the other terminal of the voltage source, means for tuning one of the circuits to a parallel resonant frequency either higher or lower than that of the other, the resonant frequencies of both of said circuits being in the region where transit time in the base-emitter junction of the transistor causes a phase shift between current and voltage whereby oscillations are generated when the first circuit is tuned to the lower frequency and no oscillations are generated when the first circuit is tuned to the higher frequency, and a pair of output terminals connected in series with the voltage source.

5. An oscillator comprising a junction transistor having emitter, collector and base electrodes, a direct current voltage source, the collector electrode being connected with one terminal of the voltage source, a condenser and a coil connected in a first parallel circuit between the emitter electrode and the other terminal of the voltage source, a condenser and a coil connected in a second parallel circuit between the base and the other terminal of the voltage source, movable core means in the field of one of said coils for tuning one of the circuits to a parallel resonant frequency either higher or lower than that of the other, the parallel resonant frequencies of both of said circuits being in the region of the alpha cut-off frequency of the transistor whereby oscillations are generated in the emitter-collector circuit at a frequency between the resonant frequencies when the first circuit is tuned to the lower frequency and no oscillations are generated when the first circuit is tuned to the higher frequency, a bypass condenser connected between the collector electrode and said other terminal of the voltage source, and a pair of output terminals connected in series with the voltage source.

6. A frequency selective circuit comprising a transistor connected in common collector configuration with an input circuit extending between base and emitter electrodes and an output circuit extending between emitter and collector electrodes, a voltage source connected with the collector to bias it in the reverse direction, a first parallel resonant circuit connected in the emitter circuit and a second parallel resonant circuit connected in the base circuit, the base circuit parallel resonant frequency being higher than the emitter circuit parallel resonant frequency whereby the input circuit presents a minimum impedance at a selected frequency intermediate said resonant frequencies.

7. A frequency selective circuit comprising a junction transistor connected in common collector configuration with an input circuit extending between base and emitter electrodes and an output circuit extending between emitter and collector electrodes, a voltage source connected with the collector to bias it in the reverse direction, a first parallel resonant circuit connected in the emitter circuit and a second parallel resonant circuit connected in the base circuit, the base circuit resonant frequency being higher than the emitter circuit resonant frequency and both resonant frequencies being in a region where transit time in the base-emitter junction of the transistor causes a phase shift between current and voltage, whereby the input circuit is series resonant at a selected frequency intermediate the frequencies of said parallel resonant circuits.

References Cited in the file of this patent

UNITED STATES PATENTS

| | | |
|---|---|---|
| 2,773,220 | Aron | Dec. 4, 1956 |
| 2,778,942 | Ehret et al. | Jan. 22, 1957 |
| 2,878,386 | Chow et al. | Mar. 17, 1959 |